(12) United States Patent  
Tsukamoto et al.

(10) Patent No.: US 7,112,864 B2
(45) Date of Patent: Sep. 26, 2006

(54) MODULE FOR OPTICAL DEVICE, AND MANUFACTURING METHOD THEREFOR

(75) Inventors: Hiroaki Tsukamoto, Yamatotakada (JP); Kazuya Fujita, Nabari (JP); Takashi Yasudome, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/804,666

(22) Filed: Mar. 18, 2004

(65) Prior Publication Data

US 2004/0189854 A1  Sep. 30, 2004

(30) Foreign Application Priority Data

Mar. 28, 2003 (JP) .............................. 2003-092329

(51) Int. Cl.
*H01L 31/0203* (2006.01)
*H01L 31/062* (2006.01)
(52) U.S. Cl. ...................... 257/433; 257/291; 257/434
(58) Field of Classification Search ................ 257/291, 257/294, 431–435
See application file for complete search history.

(56) References Cited

U.S. PATENT DOCUMENTS 6,384,397 B1  5/2002  Takiar et al. ............ 250/208.1
6,870,208 B1 * 3/2005  You et al. .................... 257/291

FOREIGN PATENT DOCUMENTS

| CN | 1354596 | 6/2002 |
|----|---------|--------|
| CN | 1396763 | 2/2003 |
| EP | 1 223 749 | 7/2002 |
| JP | 6-21414 | 1/1994 |
| JP | 11-341366 | 10/1999 |
| JP | 2002-134725 | 5/2002 |
| JP | 2002-182270 | 6/2002 |
| KR | 2002-0066010 | 8/2002 |
| KR | 2002-0085120 | 11/2002 |

* cited by examiner

*Primary Examiner*—Hung Vu
(74) *Attorney, Agent, or Firm*—David G. Conlin, Esq.; David A. Tucker, Esq.; Edwards Angell Palmer & Dodge LLP

(57) ABSTRACT

A module for an optical device being provided with a wiring substrate having a conductive wiring patterned thereon, a solid-state image sensor, a DSP for controlling the operation of the solid-state image sensor and processing a signal outputted from the same, and a lens holder being placed opposite to the solid-state image sensor and having a function of an optical path demarcating unit for demarcating the optical path to the solid-state image sensor, wherein a transparent cover bonded to the surface of the solid-state image sensor is joined to the lens holder at a joint portion. It is unnecessary to provide a focus adjuster for matching the optical distance between the lens and the solid-state image sensor with the focal length of the lens.

15 Claims, 16 Drawing Sheets

MODULE FOR OPTICAL DEVICE, AND MANUFACTURING METHOD THEREFOR

CROSS-REFERENCE TO RELATED APPLICATIONS

This Nonprovisional application claims priority under 35 U.S.C. §119(a) on Patent Application No. 2003-092329 filed in Japan on Mar. 28, 2003, the entire contents of which are hereby incorporated by reference.

BACKGROUND OF THE INVENTION

1. Field of the Invention

The invention relates to a module for an optical device suitable for a camera module and the like for capturing an image of an object, and to a manufacturing method therefor.

2. Description of Related Art

A portable electronic apparatus such as a cellular phone or the like has recently been equipped with a camera function, so that a module for an optical device such as a camera module has been developed (for example, see Japanese Patent Application Laid-Open No. 2002-182270).

FIG. 1 is a schematic view showing a section of a conventional module for an optical device. Reference numeral 30 denotes a wiring substrate 30 which has conductive wirings 31 patterned on its surface (both surfaces). The conductive wirings 31 formed on both surfaces of the wiring substrate 30 are appropriately connected to each other within the wiring substrate 30. A DSP (Digital Signal Processor) 32 is die-bonded to one side (a surface on which a lens 37 described later is placed: this surface will be hereinafter referred to as an upper surface) of the wiring substrate 30. Each connecting terminal of the DSP 32 is electrically connected to the conductive wiring 31 by a bonding wire 32w. Bonded on the upper surface of the DSP 32 is a spacer 33 that is a sheet-shaped insulative adhesive. A solid-state image sensor 34 is die-bonded on the upper surface of the spacer 33. Each connecting terminal of the solid-state image sensor 34 is electrically connected to the conductive wiring 31 by a bonding wire 34w.

Reference numeral 37 denotes an objective lens which is held at the inner peripheral portion of a focus adjuster 36. The focus adjuster 36 is provided at the inner peripheral portion close to the upper end portion of a lens holder main body 35. The lens holder main body 35 is formed such that its lower end portion is widened rather than its upper end portion. The widened lower end portion of the lens holder main body 35 is bonded to the peripheral portion of the wiring substrate 30. The focus adjuster 36 is threaded at its outer periphery, and the lens holder main body 35 is also threaded at its inner periphery close to its upper end portion. The threaded outer periphery of the focus adjuster 36 is screwed onto the threaded inner periphery close to the upper end portion of the lens holder main body 35. Accordingly, it is configured such that pivotable rotation of the focus adjuster 36 changes the mutual position, i.e., the distance between the lens 37 and the solid-state image sensor 34. It is noted that the lens holder main body 35 and the focus adjuster 36 form a lens holder for holding the lens 37. Specifically, the lens 37 is positioned by the lens holder (lens holder main body 35, focus adjuster 36) with (the surface of) the wiring substrate 30 defined as a positioning reference. Bonded to the lens holder main body 35 is an optical filter 38 that is subject to filtering treatment for cutting infrared rays in incident ray.

There may be a case where the size (especially the size in the thickness direction) of the wiring substrate 30 has a warp, distortion or the like due to variations in production, even if it is within the range of the specification value. Even after the lens holder main body 35 is bonded, such warp or distortion is present on the wiring substrate 30. Specifically, upon positioning the lens 37, there may be the case where the optical distance between the lens 37 and the solid-state image sensor 34 does not agree with the focal length f of the lens 37 due to the warp or the like on (the surface of) the wiring substrate 30 that is a positioning reference. In this case, the optical distance between the lens 37 and the solid-state image sensor 34 is required to be adjusted so as to agree with the focal length f of the lens 37. In other words, the optical distance between the lens 37 and the solid-state image sensor 34 is required to be adjusted so as to agree with the focal length f of the lens 37 by pivotably rotating the focus adjuster 36. Accordingly, the module for an optical device is finally completed by adjusting the relative position of the focus adjuster 36 to the lens holder main body 35.

FIG. 2 through FIG. 4 are schematic views each showing a section for explaining a problem of a conventional module for an optical device. FIG. 2 is a schematic view showing a case where the center portion of the wiring substrate 30 is formed into a convex shape toward the lens 37. Although the parallel relationship between the lens 37 and the wiring substrate 30 is maintained, the peripheral portion of the wiring substrate 30 is warped toward the direction apart from the lens 37, compared to its center portion. Therefore, the lens holder main body 35 whose widened lower end portion is bonded to the peripheral portion of the wiring substrate 30 is downwardly moved (in the direction apart from the lens 37) with respect to the center portion of the wiring substrate 30. This means that the positioning reference for the lens 37 is moved downward. Specifically, the optical distance between the lens 37 and the solid-state image sensor 34 becomes f−Δf (Δf is an amount of deformation of the wiring substrate 30 at the peripheral portion with respect to the center portion in the thickness direction), that is different from the focal length f of the lens 37. Accordingly, it is required to agree the solid-state image sensor 34 with the position of the focal length f of the lens 37 by performing an adjustment corresponding to the deformation amount Δf with the focus adjuster 36, i.e., by performing an adjustment for separating the solid-state image sensor 34 from the lens 37, in the state shown in FIG. 2.

FIG. 3 is a schematic view showing a case where the center portion of the wiring substrate 30 is formed into a concave shape toward the lens 37. Although the parallel relationship between the lens 37 and the wiring substrate 30 is maintained, the peripheral portion of the wiring substrate 30 comes close to the lens 37, compared to its center portion. Therefore, the lens holder main body 35 whose widened lower end portion is bonded to the peripheral portion of the wiring substrate 30 is upwardly moved (in the direction of coming close to the lens 37) with respect to the center portion of the wiring substrate 30. This means that the positioning reference for the lens 37 is moved upward. Specifically, the optical distance between the lens 37 and the solid-state image sensor 34 becomes f+Δf (Δf is an amount of deformation of the wiring substrate 30 at the peripheral portion with respect to the center portion in the thickness direction), that is different from the focal length f of the lens 37. Accordingly, it is required to agree the solid-state image sensor 34 with the position of the focal length f of the lens 37 by performing an adjustment corresponding to the deformation amount Δf with the focus adjuster 36, i.e., by performing an adjustment for making the solid-state image sensor 34 close to the lens 37, in the state shown in FIG. 3.

FIG. 4 is a schematic view showing a case where the plate thickness of the wiring substrate 30 is not uniform. In the example shown in FIG. 4, the thickness is great at the right-side end portion (right end in the figure) of the wiring substrate 30, while the thickness is small at the left-side end portion (left end in the figure) thereof. Assuming that the plane shape of the wiring substrate 30 is a rectangular, each side having approximately 10 mm, and the difference of the thickness between at the opposing ends of the wiring substrate 30 is ±0.01 mm in case where the thickness of the wiring substrate 30 is different at the opposing ends. Even if the thickness itself of the wiring substrate 30 is within the specification, the lens holder main body 35 and the focus adjuster 36 are fixed so as to be inclined with respect to the surface (plane) of the solid-state image sensor 34 when the lens holder main body 35 is bonded to the wiring substrate 30. When the lens holder main body 35 and the focus adjuster 36 are fixed so as to be inclined with respect to the surface of the solid-state image sensor 34, a deviation of an angle θ occurs between the optical axis of the lens 37 and the vertical axis of the solid-state image sensor 34, thereby incapable of correctly projecting an image of a subject onto the solid-state image sensor 34.

As described above, in the conventional optical device module, (the surface of) the wiring substrate 30 is defined as the positioning reference for the lens and the lens holder (optical path demarcating unit, focus adjuster) is bonded to the wiring substrate 30. Therefore, there may be the case where the optical distance between the lens 37 and the solid-state image sensor 34 does not agree with the focal length of the lens 37 due to variations in production such as warp or distortion on the wiring substrate 30 and, further, there is a problem that the optical axis of the lens 37 and the vertical axis of (the surface of) the solid-state image sensor 34 do not agree with each other. Therefore, an adjusting process is inevitable for matching the optical distance between the lens 37 and the solid-state image sensor 34 with the focal length of the lens 37 for each module for an optical device. In this adjusting process, an expensive system for the adjustment and a skilled worker are necessary and, further, a time required for the adjusting process is far from short. Moreover, the lens holder has to have a function of two mechanism elements of the optical path demarcating unit and the focus adjuster; therefore, it is difficult to achieve a small-sized lens holder in terms of its structure. Additionally, a mass-production is difficult since the lens holder is a mechanism element, whereby the percentage of the material cost in the production cost is high, thereby entailing an increased production cost.

BRIEF SUMMARY OF THE INVENTION

The invention is accomplished in view of the above-mentioned circumstances, and it is therefore an object of the invention to provide a small-sized and low cost module for an optical device that can be realized by that a focus adjuster for matching an optical distance between a lens and a solid-state image sensor with a focal length of the lens is not required. It is another object of the invention to provide a manufacturing method of a module for an optical device wherein a production process can be simplified since an adjusting process for matching an optical distance between a lens and a solid-state image sensor with a focal length of the lens is unnecessary.

According to the invention, a module for an optical device being provided with a solid-state image sensor having an effective pixel region formed on one side thereof and an optical path demarcating unit for demarcating an optical path from an objective lens to the effective pixel region, is characterized by comprising: a transparent cover placed opposite to the effective pixel region on the solid-state image sensor; a bonding portion for fixedly bonding the transparent cover to the solid-state image sensor; and a joint portion for fixedly joining the optical path demarcating unit to the transparent cover; whereby the objective lens is positioned with respect to the effective pixel region with the one side of the solid-state image sensor defined as a positioning reference, by fixedly joining the optical path demarcating unit to the transparent cover via the joint portion, and by fixedly bonding the transparent cover to the solid-state image sensor via the bonding portion.

A module for an optical device according to the invention is characterized in that the joint portion is joined by fixedly bonding the transparent cover and the optical path demarcating unit.

A module for an optical device according to the invention is characterized in that the transparent cover is formed to have a plane size smaller than the plane size of the one side of the solid-state image sensor.

A module for an optical device according to the invention is characterized in that the bonding portion contains a photosensitive bonding agent.

A module for an optical device according to the invention is characterized in that a space is formed between the effective pixel region and the transparent cover, and the bonding portion is formed at the peripheral portion of the effective pixel region on the one side of the solid-state image sensor.

A module for an optical device according to the invention is characterized in that the bonding portion is configured to seal the space formed between the effective pixel region and the transparent cover.

A module for an optical device according to the invention is characterized in that the lens is placed so as to oppose to the effective pixel region, and is held by the optical path demarcating unit.

A module for an optical device according to the invention is characterized in that an image processing device is bonded to a wiring substrate, and the solid-state image sensor is bonded to a plane portion of the image processing device.

A module for an optical device according to the invention is characterized by being used as a module for a camera.

According to the invention, a manufacturing method of a module for an optical device being provided with a solid-state image sensor having an effective pixel region formed on one side thereof, and an optical path demarcating unit for demarcating an optical path to the effective pixel region, is characterized by comprising steps of: placing a transparent cover so as to oppose to the effective pixel region; bonding the transparent cover to the solid-state image sensor; and joining the optical path demarcating unit to the transparent cover.

A manufacturing method of a module for an optical device according to the invention is characterized in that the step of joining the optical path demarcating unit to the transparent cover is executed by bonding the transparent cover and the optical path demarcating unit.

A manufacturing method of a module for an optical device according to the invention is characterized in that a photosensitive bonding agent is used for bonding the solid-state image sensor and the transparent cover.

A manufacturing method of a module for an optical device according to the invention is characterized in that bonding of the solid-state image sensor and the transparent cover is executed by patterning the photosensitive bonding agent at the peripheral portion of the effective pixel region on the one side of the solid-state image sensor.

A manufacturing method of a module for an optical device according to the invention is characterized by further comprising a step of bonding the solid-state image sensor to a plane portion of an image processing device bonded to a wiring substrate.

A manufacturing method of a module for an optical device according to the invention is characterized in that the module for an optical device is used as a module for a camera.

In the module for an optical device and its manufacturing method according to the invention, the lens holder is joined (bonded) to the transparent cover with the surface of the transparent cover defined as a positioning reference for the lens, whereby the optical distance between the lens and the solid-state image sensor precisely agrees with the focal length of the lens, regardless of the state of the wiring substrate. Further, the optical axis of the lens and the vertical axis of the solid-state image sensor (effective pixel region) precisely agree with each other.

Moreover, in the module for an optical device and its manufacturing method according to the invention, the plane size of the transparent cover is formed to be smaller than the plane size of the one side (the surface having the effective pixel region) of the solid-state image sensor, whereby the module for an optical device can be made compact. In case where the module is used as a camera module, in particular, a camera itself is minimized.

Moreover, in the module for an optical device and its manufacturing method according to the invention, the bonding portion for bonding the solid-state image sensor and the transparent cover contains a photosensitive bonding agent, whereby the bonding portion is easily and efficiently formed with high precision by patterning with a photolithography technique. Further, the bonding portion can similarly be formed on either the solid-state image sensor and the transparent cover.

The above and further objects and features of the invention will more fully be apparent from the following detailed description with accompanying drawings.

DETAILED DESCRIPTION OF THE PREFERRED EMBODIMENTS

A module for an optical device according to the invention will be described below with reference to drawings showing its preferred embodiment.

Figure 1:
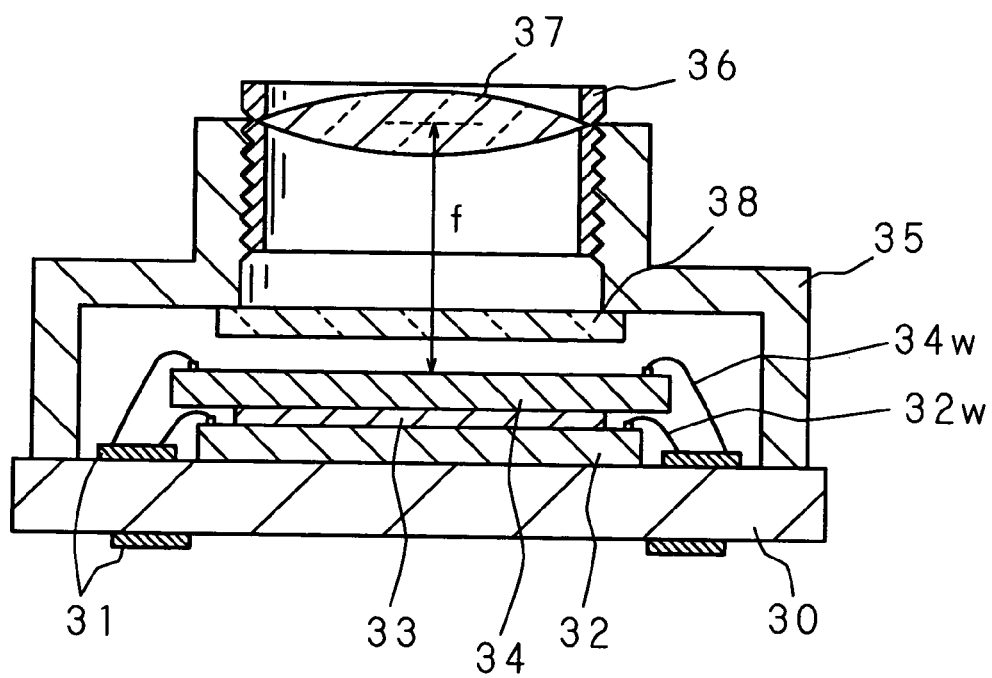
FIG. 1 is a schematic view showing a section of a conventional module for an optical device.
Figure 2:
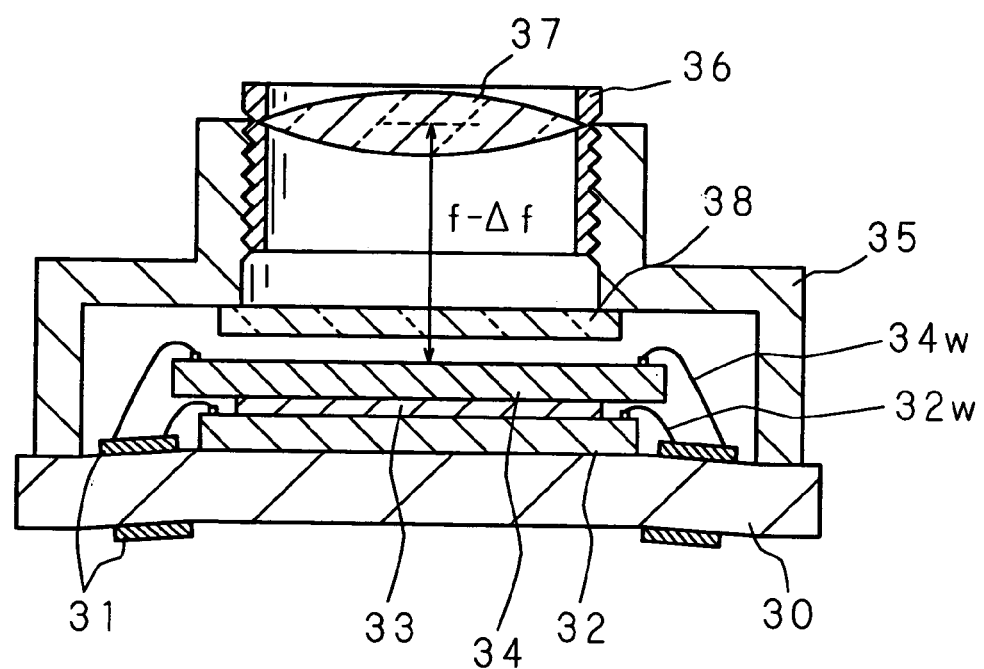
FIG. 2 is a schematic view showing a section for describing a problem of the conventional module for an optical device.
Figure 3:
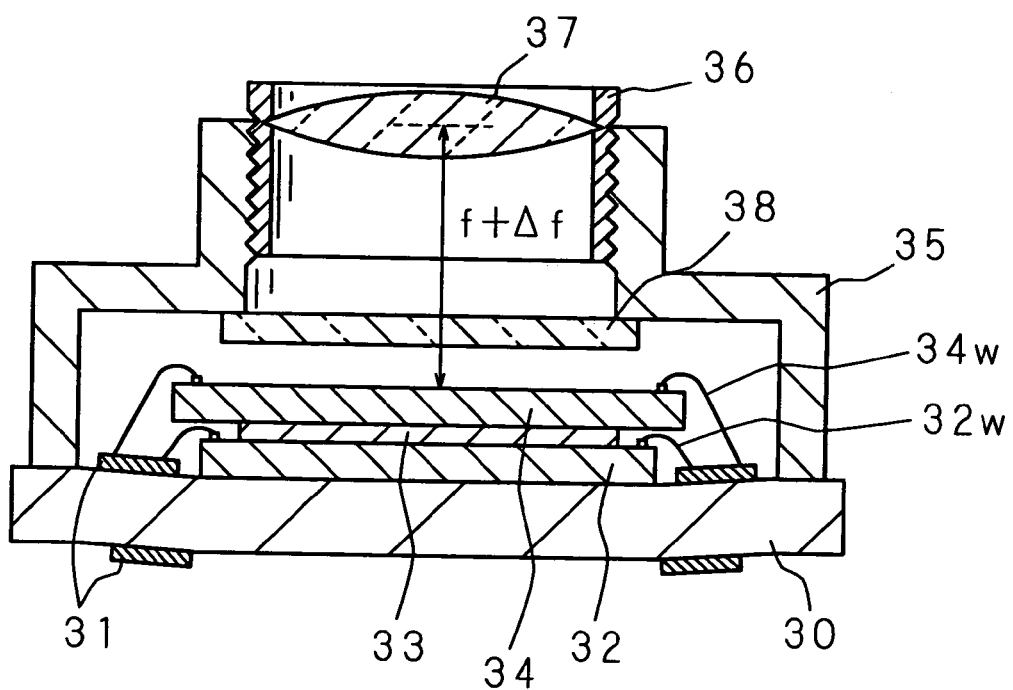
FIG. 3 is a schematic view showing a section for describing a problem of the conventional module for an optical device.
Figure 4:
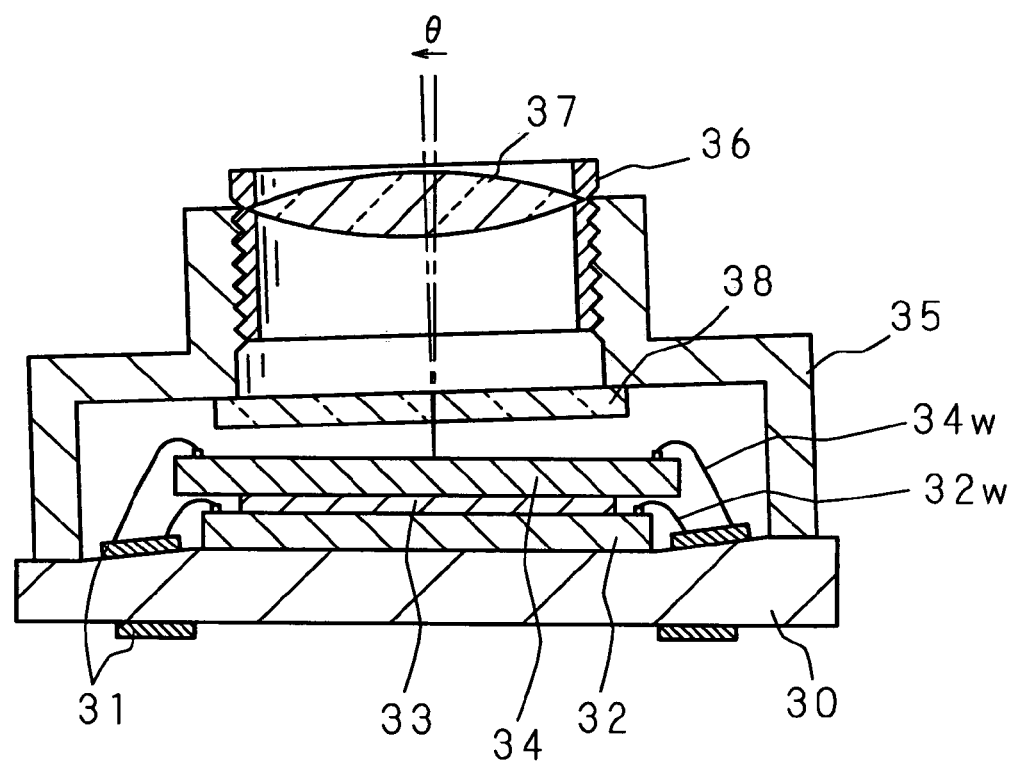
FIG. 4 is a schematic view showing a section for describing a problem of the conventional module for an optical device.
Figure 5:
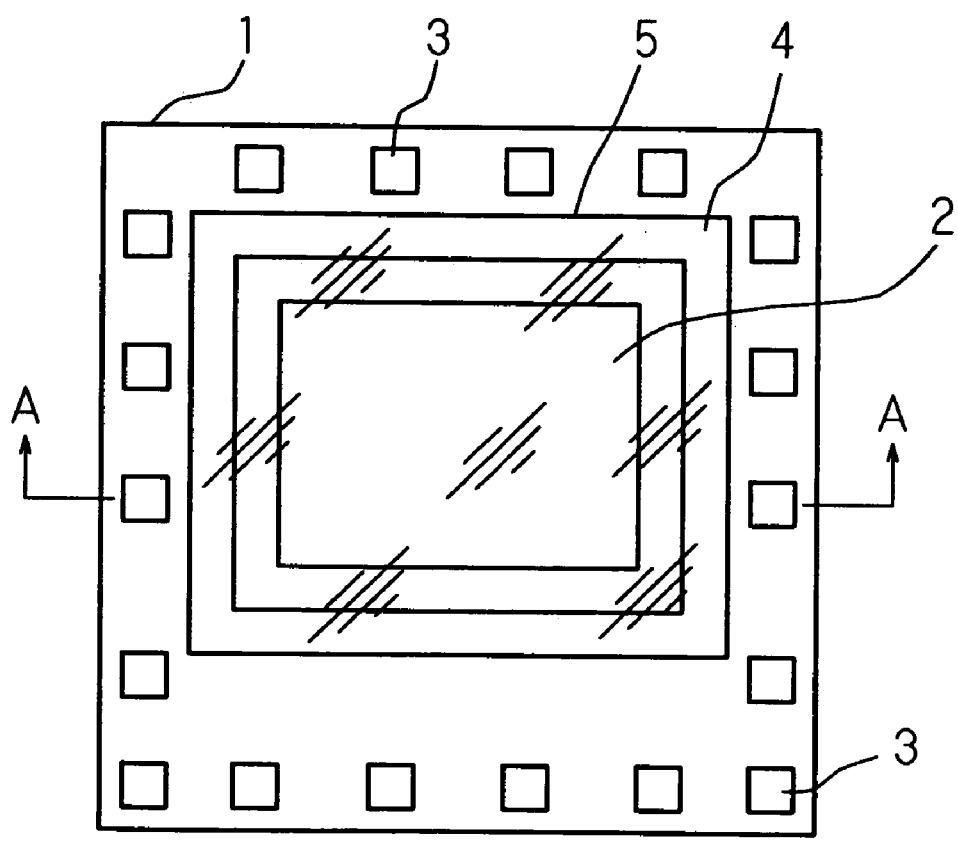
FIG. 5 is a schematic plan view showing a plane shape of a solid-state image sensor, according to a first constructional example, used in a module for an optical device according to the invention.
Figure 6:
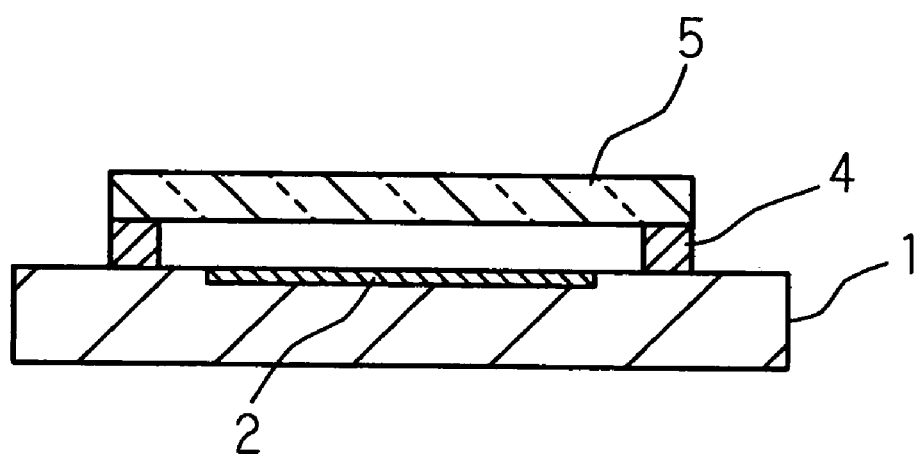
FIG. 6 is a schematic sectional view taken along line A—A in FIG. 5.

FIG. 5 is a schematic plan view showing a plane shape of a solid-state image sensor, according to a first constructional example, used in a module for an optical device according to the invention. FIG. 6 is a schematic sectional view taken along line A—A in FIG. 5. Reference numeral 1 denotes the solid-state image sensor which is formed on a semiconductor substrate such as silicon with a semiconductor processing technique. An effective pixel region 2 for performing a photoelectric conversion is formed at the center portion of one side (the surface on which a lens 13 described later is placed: this surface will be hereinafter referred to as an upper surface) of the solid-state image sensor 1. Formed at the peripheral portion of the solid-state image sensor 1 are bonding pads 3 that are connecting terminals for establishing a connection to an external circuit and perform input/output of an electrical signal or the like. A transparent cover 5 arranged opposite to the effective pixel region 2 is bonded via a bonding portion 4 to the upper surface of the solid-state image sensor 1 having the effective pixel region 2 formed thereon. The transparent cover 5 protects (the surface of) the effective pixel region 2 from external moisture, dust (scrap) or the like. The bonding portion 4 is formed at the outside of the outer periphery of the effective pixel region 2 on the upper surface of the solid-state image sensor 1 for bonding the transparent cover 5 to the solid-state image sensor 1. The transparent cover 5 transmits incident light from the outside, whereby the solid-state image sensor 1 makes the effective pixels (light-receiving elements) arranged on the effective pixel region 2 receive the incident light (detect the incident light). The transparent cover 5 is made of a transparent material such as glass or the like. The transparent cover 5 opposes to the effective pixel region 2 to cover at least the entire effective pixel region 2, thereby protecting the effective pixel region 2 from the outside environment. The plane size of the transparent cover 5 is formed to be smaller than the plane size of the upper surface of the solid-state image sensor 1, thereby being capable of making the module for an optical device compact. In case where the module is used as a camera module, in particular, a small-sized camera having excellent portability can be realized.

In case where the transparent cover 5 is bonded by the bonding portion 4 at the outside region of the effective pixel region 2, it is preferably to form a space between the effective pixel region 2 and the transparent cover 5 in the upper surface of the solid-state image sensor 1. To form the space between the effective pixel region 2 and the transparent cover 5 allows incidence of light transmitted through the transparent cover 5 from the outside to the effective pixel region 2 as it is, so that optical loss does not occur on the way of the optical path. Specifically, to form the space between the effective pixel region 2 and the transparent cover 5 can maintain transparent property even after forming the transparent cover 5.

The outer periphery of the space formed between the effective pixel region 2 and the transparent cover 5, both being arranged so as to be opposite to each other, is preferably sealed perfectly with the bonding portion 4. Perfectly sealing the outer periphery of the space formed between the effective pixel region 2 and the transparent cover 5 can prevent the occurrence of the defect on the effective pixel region 2 caused by an invasion of moisture, invasion and adherence of dust, scratch or the like on (the surface of the effective pixel region 2 during the subsequent processes. This allows to realize a solid-state image sensor (i.e., a module for an optical device) having excellent production yield and high reliability.

In case where the solid-state image sensor 1 is built in an optical device such as a digital still camera or a video camera, the transparent cover 5 is required to have a function of shielding infrared rays from the outside in addition to the function of protecting the surface of the effective pixel region 2 from dust, scratch or the like. In this case, an infrared ray shielding film can be formed on the surface of the transparent cover 5 in order that it functions as an optical filter.

The bonding portion 4 can be formed by uniformly applying a bonding agent obtained by mixing a photosensitive bonding agent such as, for example, UV (Ultraviolet Ray) curable resin that is an acryl-based resin and a thermosetting resin such as, for example, an epoxy-based resin, on the upper surface of the solid-state image sensor 1 (or the transparent cover 5), whereupon a patterning is performed by using a known photolithography technique. In case where plural solid-state image sensors 1 are manufactured on a semiconductor wafer, the bonding portion 4 can simultaneously be formed with respect to the respective plural solid-state image sensors 1. Instead of this, in a state of a transparent plate material (base material of the transparent cover 5) before plural transparent covers 5 are independently cut, the bonding portion 4 can simultaneously be formed with respect to the respective plural transparent covers 5. In either case, the bonding portion 4 can efficiently be formed.

The reason why the photosensitive bonding agent is mixed with the thermosetting resin is as follows. Mixing the photosensitive bonding agent with the thermosetting resin can give photosensitivity to the bonding agent, whereby the patterning of the bonding portion 4 can easily be performed with high precision by carrying out a process such as exposure and development with the photolithography technique. The fact that the patterning of the bonding portion 4 can be performed with high precision means that the bonding portion 4 can be formed with high precision even in case where the region other than the effective pixel region 2 on the solid-state image sensor 1 is narrow. Usable patterning methods of the bonding portion 4 include, in addition to the above-mentioned photolithography technique, a method wherein a bonding agent (e.g., an epoxy resin or the like) is patterned with a printing method, a method wherein a bonding agent is patterned with a dispense method and a method using a bonding sheet formed into a frame. It is possible to appropriately select any one of them according to need.

The transparent cover 5 may be bonded to the individual solid-state image sensor 1 independently, but when plural solid-state image sensors 1 are formed on a wafer, the transparent cover 5 can simultaneously be bonded to all solid-state image sensors 1, with the result that the transparent cover 5 can efficiently be formed. For example, a single transparent plate material (base material of the transparent cover 5) is arranged so as to be opposite to all plural solid-state image sensors 1 formed on the semiconductor wafer, whereupon the transparent plate material is simultaneously bonded to the bonding portion 4 formed corresponding to all solid-state image sensors 1. Then, the transparent plate material (base material of the transparent cover 5) is cut so as to correspond to each solid-state image sensor 1, thereby forming the transparent cover 5 on each solid-state image sensor 1. Further, contrary to this, the bonding portion 4 is formed in advance on the transparent plate material (base material of the transparent cover 5) so as to correspond to each solid-state image sensor 1, whereupon the transparent plate material (transparent cover 5) is bonded to the solid-state image sensors 1 formed on the semiconductor wafer and, then, cut so as to correspond to each solid-state image sensor 1, thereby forming the transparent cover 5 on each solid-state image sensor 1. Moreover, the plane size of the transparent cover 5 formed as described above can be smaller than the plane size of the upper surface of the solid-state image sensor 1, thereby achieving the small-sized solid-state image sensor 1. It is noted that the transparent cover 5 aims to protect the effective pixel region 2 of the solid-state image sensor 1 from the outside environment, so that it may be formed by any method so long as the same effect can be achieved.

Figure 7:
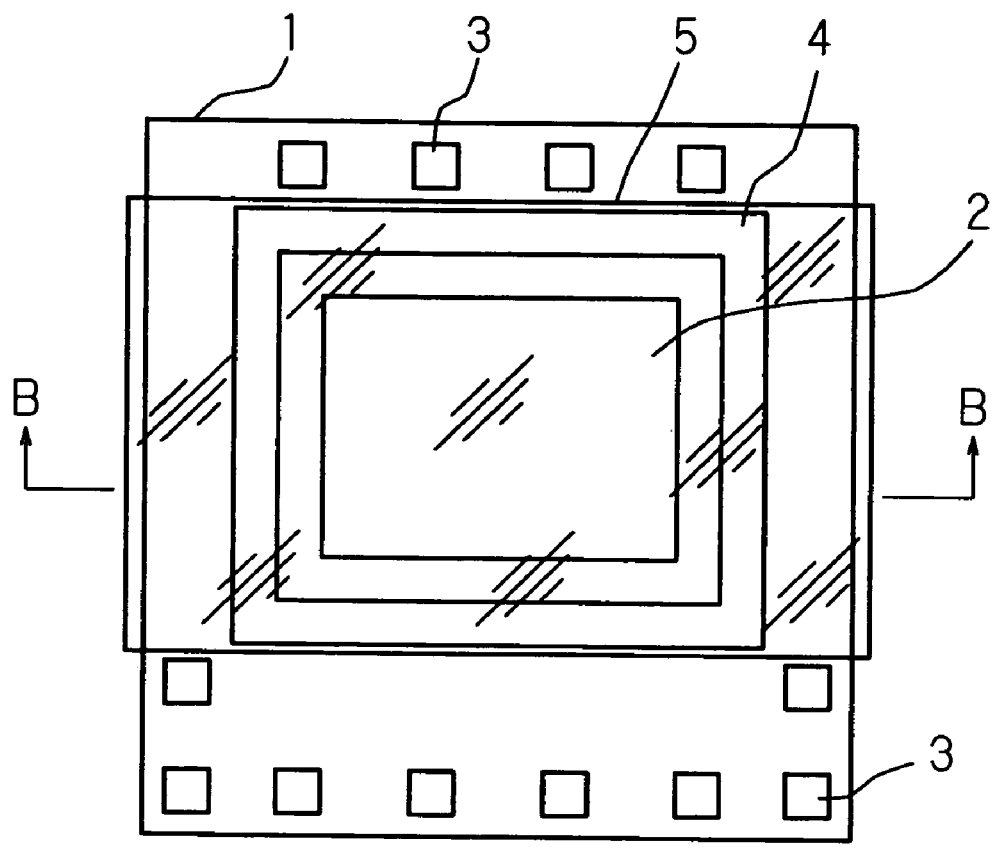
FIG. 7 is a schematic plan view showing a plane shape of a solid-state image sensor, according to a second constructional example, used in a module for an optical device according to the invention.
Figure 8:
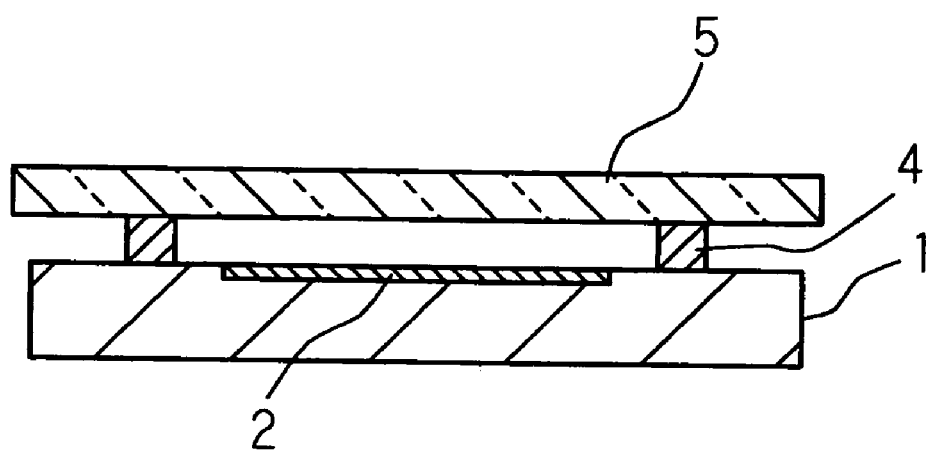
FIG. 8 is a schematic sectional view taken along line B—B in FIG. 7.

FIG. 7 is a schematic plan view showing a plane shape of a solid-state image sensor, according to a second constructional example, used in a module for an optical device according to the invention. FIG. 8 is a sectional view taken along line B—B in FIG. 7. This second constructional example has basically the same construction as that of the first constructional example shown in FIG. 5 and FIG. 6, so that the same and corresponding constituent elements are given by the same numerals and its description will not be given. This second constructional example shows the case where the plane size of the transparent cover 5 in one direction (the size in the side-to-side direction in FIG. 7) is greater than the solid-state image sensor 1. This second constructional example can be applied to the case where the transparent cover 5 having the plane size greater than the solid-state image sensor 1 is required to be bonded.

Figure 9:
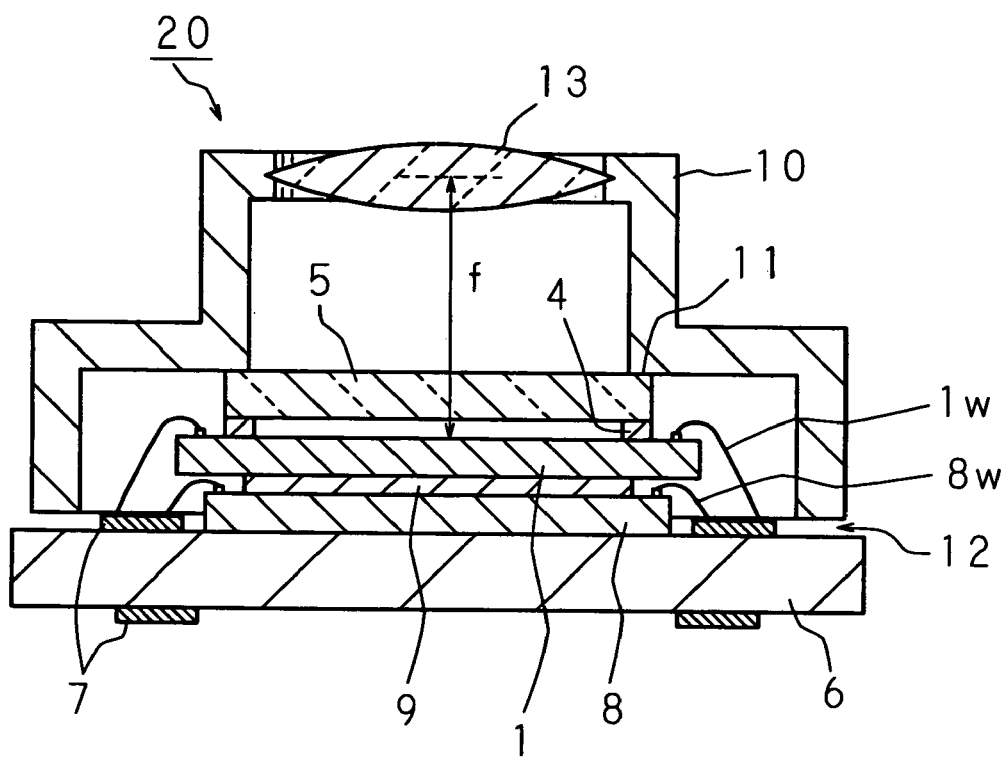
FIG. 9 is a schematic sectional view showing a section of a module for an optical device according to the invention.

FIG. 9 is a schematic sectional view showing a section of a module for an optical device according to the invention, to which the above-mentioned solid-state image sensor 1 is incorporated. The plan view of the module for an optical device is not be given. The basic shape thereof is a rectangle (square or rectangle) seen in a plane, and it can appropriately be changed according to need. Further, constituent elements same as or corresponding to the constituent elements in FIG. 5 through FIG. 8 are given by the same numerals, and its detailed description will not be given.

A module 20 for an optical device is constructed by a wiring substrate 6 having a conductive wiring 7 patterned on both front and back surfaces, a solid-state image sensor 1, a DSP (Digital Signal Processor) 8 as an image processing device that controls the operation of the solid-state image sensor 1 and processes a signal outputted from the solid-state image sensor 1, and a lens holder 10 that is placed opposite to the solid-state image sensor 1 and functions as an optical path demarcating unit for demarcating an optical path to the solid-state image sensor 1 (to an effective pixel region 2 not shown in FIG. 9). The solid-state image sensor 1 has a configuration shown in FIG. 5 and FIG. 6 or in FIG. 7 and FIG. 8. Therefore, the transparent cover 5 bonded on the surface of the solid-state image sensor 1 with the bonding portion 4 and the lens holder 10 are joined at a joint portion 11. The lens holder 10 holds a lens 13 at its inner periphery on the upper end portion. The lens holder 10 is formed such that its lower end portion is widened rather than its upper end portion. The size of the widened lower end portion of the lens holder 10 approximately agrees with the size of the peripheral portion of the wiring substrate 6. Different from the above-mentioned conventional example, the lower end portion of the lens holder 10 is not bonded to the wiring substrate 6, but a gap is normally formed between the upper surface of the wiring substrate 6 and the lower end portion of the lens holder 10 in the module 20 for an optical device according to the invention. This gap is referred to as an adjusting portion 12, the detail of which is described later.

Specifically, the lens holder 10 is indirectly fixed to the wiring substrate 6 via the DSP 8, spacer 9, solid-state image sensor 1, bonding portion 4 and transparent cover 5, but it is directly fixed to the transparent cover 5. Therefore, the relative positional relationship between the lens 13 held by the lens holder 10 and the transparent cover 5 and the relative positional relationship between the transparent cover 5 and the solid-state image sensor 1 are not influenced by the state of the wiring substrate 6, so that the relative positional relationship between the lens 13 and the solid-state image sensor 1 (effective pixel region 2) is not also influenced by the state of the wiring substrate 6.

As shown in FIG. 5 through FIG. 8, the solid-state image sensor 1 used in the module 20 for an optical device according to the invention has the effective pixel region 2 on its upper surface, wherein the transparent cover 5 is bonded with the bonding portion 4 so as to cover the effective pixel region 2. The module for an optical device according to the invention can be minimized (made thin-sized, made lightweight) by mounting the solid-state image sensor 1 wherein the transparent cover 5 having a plane size smaller than that of the upper surface of the solid-state image sensor 1 is mounted (bonded with the bonding portion 4) opposite to the effective pixel region 2 as described above. Further, the wiring substrate 6, DSP 8, solid-state image sensor 1 and transparent cover 5 are laminated to form a laminate structure, thereby being capable of realizing a further minimization.

The module 20 for an optical device is assembled as schematically described below. At first, the DSP 8 is placed and die-bonded on the upper surface (in FIG. 9, the surface on which the lens 13 is placed) of the wiring substrate 6 having formed thereon the conductive wiring 7, and further, each connecting terminal of the DSP 8 is connected to the conductive wiring 7 by a bonding wire 8w. It is noted that a passive member (not shown) such as a resistance or the like may be mounded on both surfaces of the wiring substrate 6 in addition to the DSP 8. Subsequently, the surface of the solid-state image sensor 1 on which the transparent cover 5 is not bonded is placed and die-bonded on the upper surface of the DSP 8 via the spacer 9 that is a sheet-shaped insulative bonding agent. Further, each connecting terminal of the solid-state image sensor 1 is connected to the conductive wiring 7 by a bonding wire 1w. The DSP 8 is preferably a semiconductor chip (bare chip) from the viewpoint of minimization, but it may be a packaged one (resin encapsulation) with, for example, CSP (Chip Size Package) technique. When the DSP 8 is packaged, the spacer 9 and bonding wire 8w are unnecessary, whereby the connecting terminal led from the package may directly be connected to the conductive wiring 7 and the solid-state image sensor 1 may directly be bonded on the plane portion of the upper surface of the package.

Thereafter, a bonding agent is applied on the peripheral portion (the portion corresponding to the joint portion 11) on the exposed surface (upper surface in FIG. 9) of the transparent cover 5 and, then, the transparent cover 5 and the lens holder 10 are positioned to be joined (bonded) by the bonding agent applied on the joint portion 11, thereby forming the module 20 for an optical device according to the invention. Specifically, in the module 20 for an optical device according to the invention, the lens holder 10 can be positioned with the upper surface (the surface on the lens 13 side) of the transparent cover 5 defined as a positioning reference of the lens 13. An epoxy-based resin whose viscosity is adjusted for achieving a thin application is suitable for the bonding agent used for the joint portion 11, but a sheet-shaped bonding agent may be used that is shaped in advance into a rectangular frame corresponding to the joint portion 11, i.e., corresponding to the peripheral portion of the transparent cover 5.

As described above, in the module 20 for an optical device according to the invention, the lens holder 10 (in other words, the lens 13) is positioned with the surface of the transparent cover 5 defined as the positioning reference of the lens 13, whereby the optical distance between the solid-state image sensor 1 and the lens 13 can correctly and precisely be agreed with the focal length f of the lens 13. It is needless to say that, in this case, the thickness of the bonding portion 4 and the thickness of the transparent cover 5 are considered in advance. The lens holder 10 has a function of an optical path demarcating unit for demarcating an optical path to the solid-state image sensor 1 (transparent cover 5) and a function of protecting means for protecting the solid-state image sensor 1 and the DSP 8 from the external environment in addition to the function of holding the lens 13. The lens 13 and the lens holder 10 are preferably formed in one body in advance, but not limited thereto. The lens 13 may be assembled separately to the lens holder 10. In this case, the specification of the lens 13 can freely be changed, thereby being capable of manufacturing a module for an optical device having wide general-purpose property. Moreover, a shutter function may be given to the lens holder 10.

The adjusting portion 12 is shown in FIG. 9 that is a gap formed between the wiring substrate 6 and the lens holder 10 for describing the effect. However, the wiring substrate 6 and the lens holder 10 may be bonded by filling a bonding agent in this adjusting portion 12. In case where the wiring substrate 6 and the lens holder 10 are bonded by the bonding agent in the adjusting portion 12, the semiconductor device such as the solid-state image sensor 1 or the DSP 8 is perfectly sealed by the wiring substrate 6 and the lens holder 10. This can prevent the external influence on the solid-state image sensor 1, the DSP 8 or the like, thereby being capable of further enhancing reliability. In case where the adjusting portion 12 is bonded by the bonding agent, it is configured such that the influence caused by the warp or distortion of the wiring substrate 6 is absorbed between the joint portion 11 and the adjusting portion 12 in the lens holder 10, while the same influence is absorbed between the end portion of the DSP 8 and the adjusting portion 12 in the wiring substrate 6, resulting in preventing the influence of a stress caused on the joint portion 11 due to the bonding of the adjusting portion 12. Moreover, the influence of the stress caused on the joint portion 11 with the deformation of the wiring substrate 6 can further be reduced if the bonding agent having flexibility greater than that of the bonding agent used at the joint portion 11 is used for the adjusting portion 12.

Although the above-mentioned embodiment is described with the case where the transparent cover 5 and the lens holder 10 are joined by the bonding agent, the joint method in the joint portion 11 is not limited to the bonding. The transparent cover 5 and the lens holder 10 may be engaged with each other. For example, an engagement (threaded engagement) with a screw, or fitting mechanism may be applied. Specifically, any joint method may be applied so long as the transparent cover 5 and the lens holder 10 are joined with (the surface of) the transparent cover 5 defined as the positioning reference of the lens 13. In the module for an optical device according to the invention, the lens holder 10 only has a configuration that can hold the lens 13 and can be joined to the transparent cover 5 as described above, so that the focus adjuster required in the conventional module for an optical device is unnecessary, thereby simplifying the structure and realizing small-sized (light-weight) and low-cost module.

Figure 10:
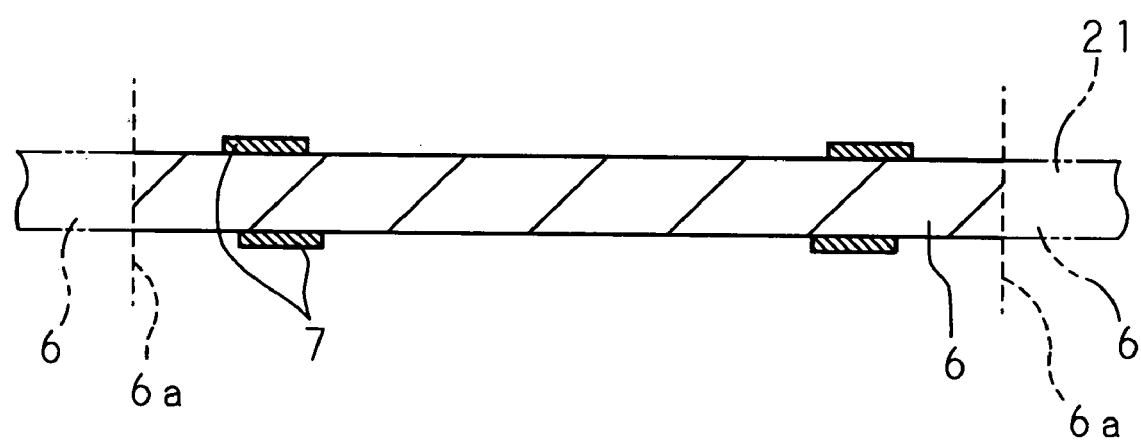
FIG. 10 is a schematic sectional view showing process for describing a manufacturing method of a module for an optical device according to the invention.

FIG. 10 through FIG. 13 are schematic sectional views each showing a process for describing a manufacturing method of the module for an optical device according to the invention. The constituent elements same as those in FIG. 9 are given by same numerals; therefore, description thereof will not be repeated herein. FIG. 10 shows a multiple wiring substrate 21 wherein plural wiring substrates 6 are connected. The multiple wiring substrate 21 has the plural wiring substrates 6, each corresponding to each module 20, connected in, for example, a matrix or in a long-sized manner. Using the multiple wiring substrate 21 can simultaneously manufacture the plural modules 20 for an optical device so as to correspond to each wiring substrate 6. The multiple wiring substrate 21 is divided by a parting line 6*a* into an area corresponding to each wiring substrate 6, and finally separated into each wiring substrate 6 (each module 20 for an optical device) by being divided by the parting line 6*a*. Described below is a process for simultaneously manufacturing the plural modules 20 by using the multiple wiring substrate 21. It is noted that the module 20 for an optical device according to the invention may be manufactured by using the individual wiring substrate 6 separated individually at the beginning without using the multiple wiring substrate 21.

A ceramic substrate, glass epoxy resin substrate, alumina substrate or the like can be used for the multiple wiring substrate 21. The thickness of the multiple substrate 21 is preferably about 0.05 through 2.00 mm in order to maintain a mechanical strength. The conductive wiring 7 is patterned on the multiple wiring substrate 21 so as to correspond to each wiring substrate 6. FIG. 10 shows the case where the conductive wiring 7 is formed on both surfaces of the multiple wiring substrate 21. The conductive wiring 7 may be formed only on one surface of the multiple wiring substrate 21, but considering the mounting density, it is preferable that the conductive wiring is formed on both surfaces to lead the connecting terminal for establishing a connection to the outside from the surface of the wiring substrate 6 on which the solid-state image sensor 1 is mounted and its opposite surface. The conductive wirings 7 formed on both surfaces of the wiring substrate 6 are connected to each other within the wiring substrate 6 (not shown). Further, the conductive wiring 7 is appropriately designed in accordance with the specification of the intended module 20 for an optical device. The same process is simultaneously performed in the adjacent wiring substrate 6 connected to each other in the multiple wiring substrate 21, so that the manufacturing process for one wiring substrate 6 will be described and the description about the adjacent wiring substrate 6 will not be given.

Figure 11:
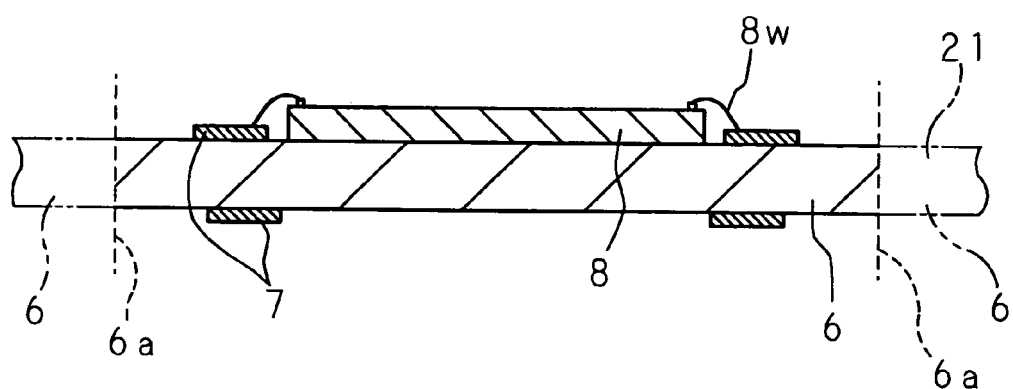
FIG. 11 is a schematic sectional view showing process for describing a manufacturing method of a module for an optical device according to the invention.

FIG. 11 is a schematic view showing a mounting state of the DSP 8. The DSP 8 is placed and die-bonded on the upper surface of the wiring substrate 6 (multiple wiring substrate 21) having the conductive wiring 7 formed thereon. Thereafter, (the connecting terminal of) the DSP 8 and the conductive wiring 7 are wire-bonded with the bonding wire 8*w* to thereby be electrically connected. A flip chip bonding may be used instead of the wire bonding as the connection method.

Figure 12:
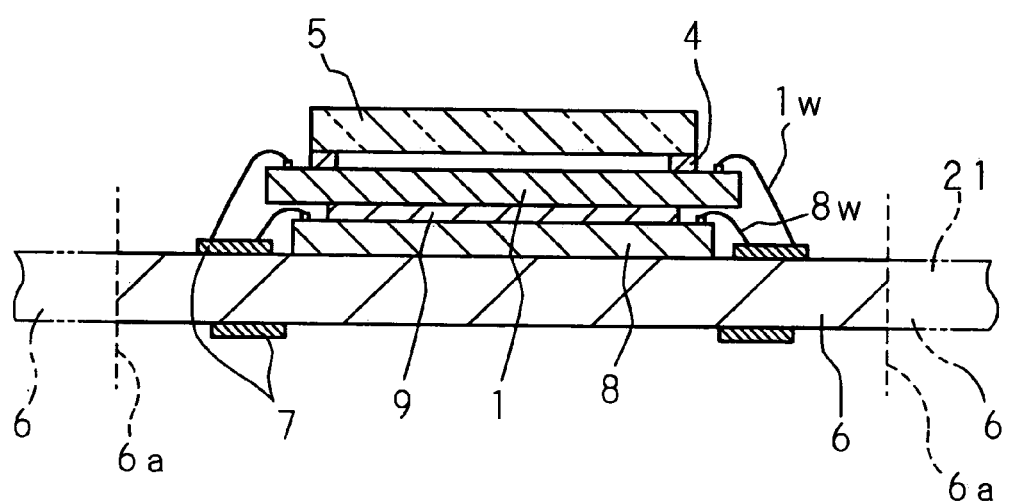
FIG. 12 is a schematic sectional view showing process for describing a manufacturing method of a module for an optical device according to the invention.

FIG. 12 is a schematic view showing a mounting state of the solid-state image sensor 1. After the DSP 8 is mounted as described above, the spacer 9 that is a sheet-shaped insulative bonding agent is placed on the plane portion of the top surface of the DSP 8, and the DSP 8 and the spacer 9 are bonded to each other. The material suitable for the spacer 9 is the one that has an insulating property and bonding property and has a slight shock-absorbing property upon the bonding so as not to affect on the surface of the DSP 8. Examples of the suitable spacer 9 include sheet-shaped resin made of acryl or the like with a thickness of about 0.05 through 1.00 mm. Subsequently, the solid-state image sensor 1 is placed on the upper surface of the spacer 9 and die-bonded to the spacer 9. Thereafter, (the connecting terminal of) the solid-state image sensor 1 and the conductive wiring 7 are wire-bonded by the bonding wire 1*w* to thereby be electrically connected. The transparent cover 5 is preferably formed in advance (before the solid-state image sensor 1 is placed on the spacer 9) on the upper surface of the solid-state image sensor 1 from the viewpoint of preventing the occurrence of the defect such as a scratch on the surface of the solid-state image sensor 1.

Figure 13:
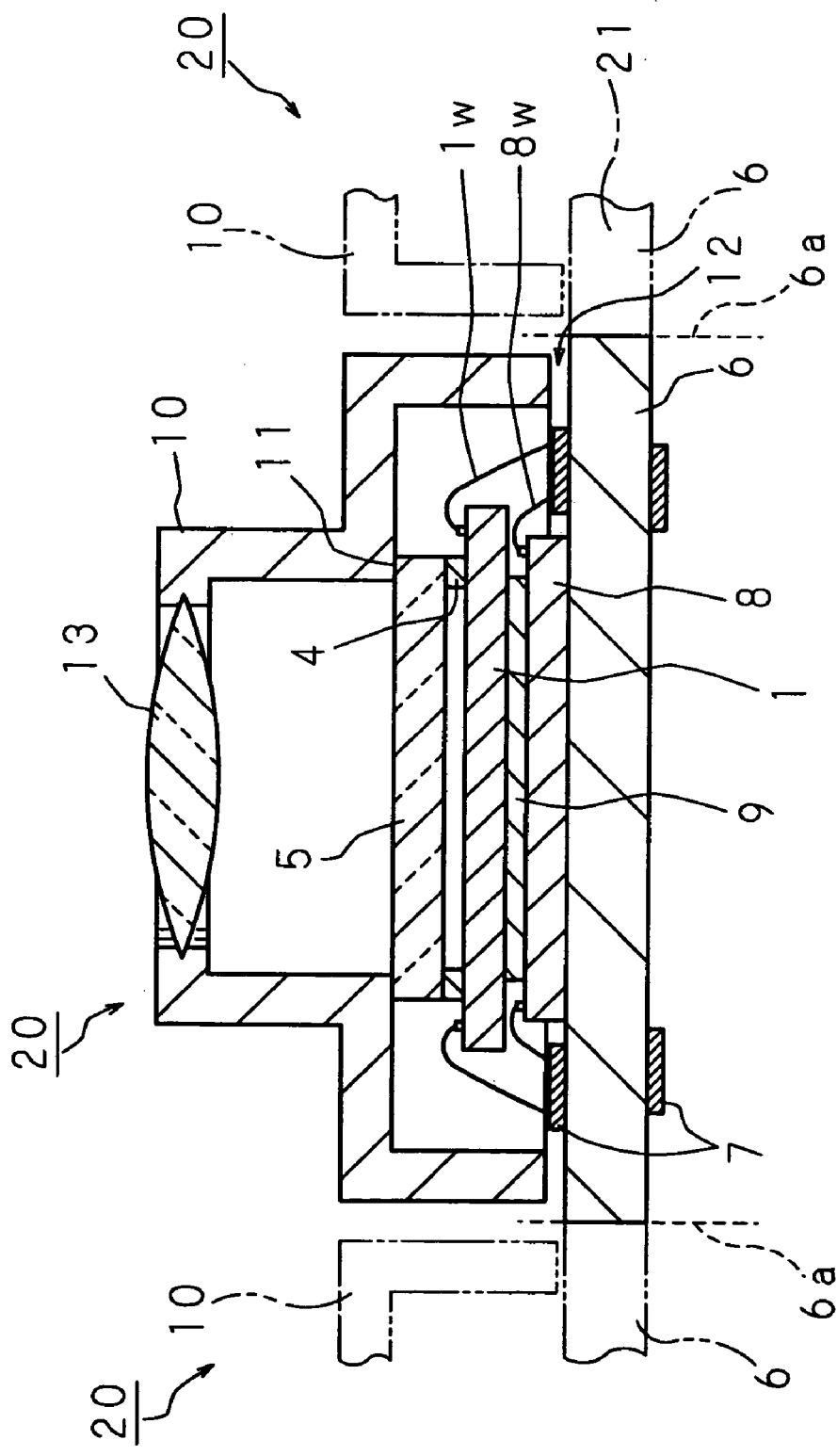
FIG. 13 is a schematic sectional view showing process for describing a manufacturing method of a module for an optical device according to the invention.

FIG. 13 is a schematic view showing a mounting state of the lens holder 10. After the bonding agent is applied to the joint portion 11 of the transparent cover 5 in each wiring substrate 6, the lens holder 10 (and the lens 13) is appropriately positioned to the transparent cover 5, whereupon the transparent cover 5 and the lens holder 10 are bonded to each other by the bonding agent applied to the joint portion 11. The wiring substrate 6 and the lens holder 10 may be bonded to each other by applying the bonding agent having flexibility to the adjusting portion 12. Plural lens-fitted modules 20 for an optical device are formed corresponding to each wiring substrate 6 on the multiple wiring substrate 21 by the process shown in FIG. 13. Thereafter, the plural modules 20 for an optical device formed on the multiple wiring substrate 6 are divided (cut) along the parting line 6*a* by using a dicing, rooter, press-die or the like to thereby be separated one by one, resulting in obtaining an individual module 20 for an optical device shown in FIG. 9.

In case where the lens 13 and the lens holder 10 are made as one body and the lens holder 10 is joined to the transparent cover 5, the solid-state image sensor 1 and the DSP 8 can surely be protected in the following processes, and moreover, a further small-sized module for an optical device can be manufactured. Further, the positioning of the lens 13 to the solid-state image sensor 1 can be simplified with enhanced precision, thereby being capable of providing uniformity in optical characteristic of the module for an optical device. Although the lens holder 10 is made individual corresponding to each wiring substrate 6 in the above-mentioned description, a multiple lens holder wherein the plural lens holders 10 are connected to each other may be used corresponding to the multiple wiring substrate 21. In this case, the positioning process of the lens holder 10 to the transparent cover 5 can further be simplified.

Moreover, the solid-state image sensor 1 having the effective pixel region 2 protected by the transparent cover 5 is mounted on the module 20 for an optical device, whereby there is no fear that dusts are adhered onto the surface of the effective pixel region 2 of the solid-state image sensor 1 in the processes subsequent to the process of mounting the solid-state image sensor 1. Therefore, the module 20 for an optical device can be manufactured even under environment having relatively low cleanness. Consequently, the module for an optical device and its manufacturing method can be realized wherein the yield is improved, process is simplified and cost is reduced. Moreover, using the multiple wiring substrate 21 having the plural wiring substrates 6 connected to each other can simultaneously manufacture the plural modules 20 for an optical device, so that the production efficiency of the module for an optical device can further be enhanced and the characteristic of the module for an optical device can be unified.

Figure 14:
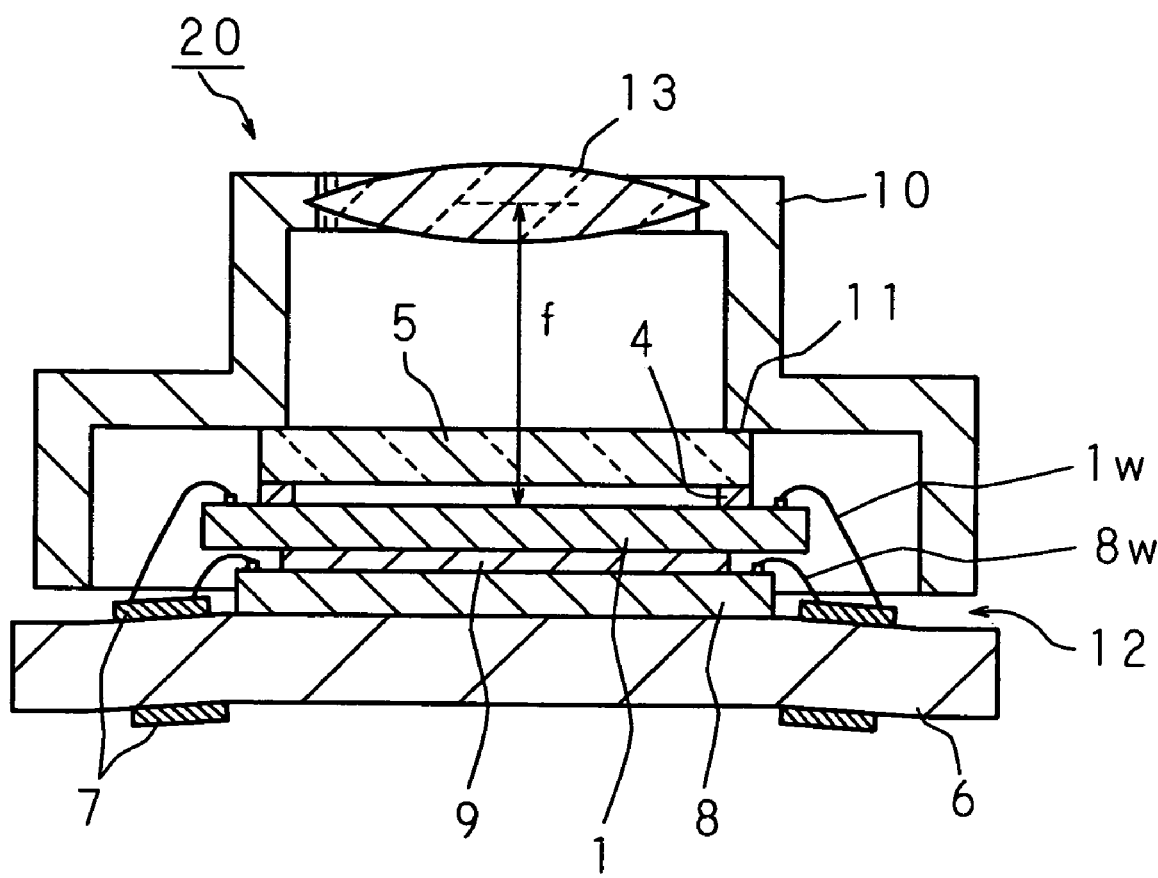
FIG. 14 is a schematic sectional view for describing an effect of a module for an optical device according to the invention.
Figure 15:
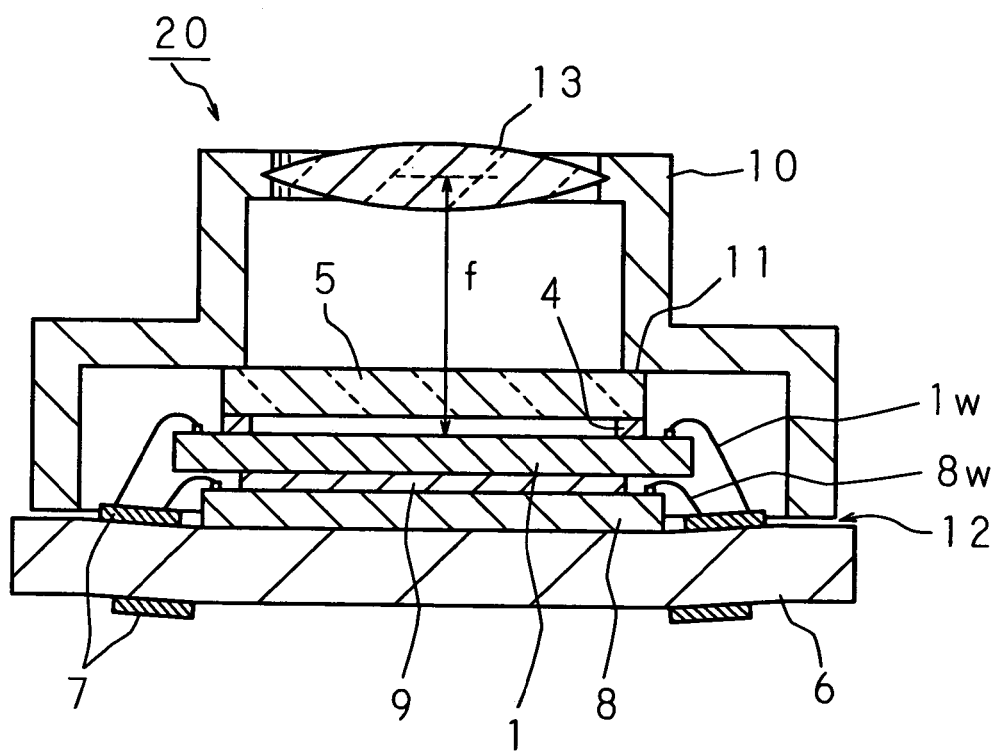
FIG. 15 is a schematic sectional view for describing an effect of a module for an optical device according to the invention.
Figure 16:
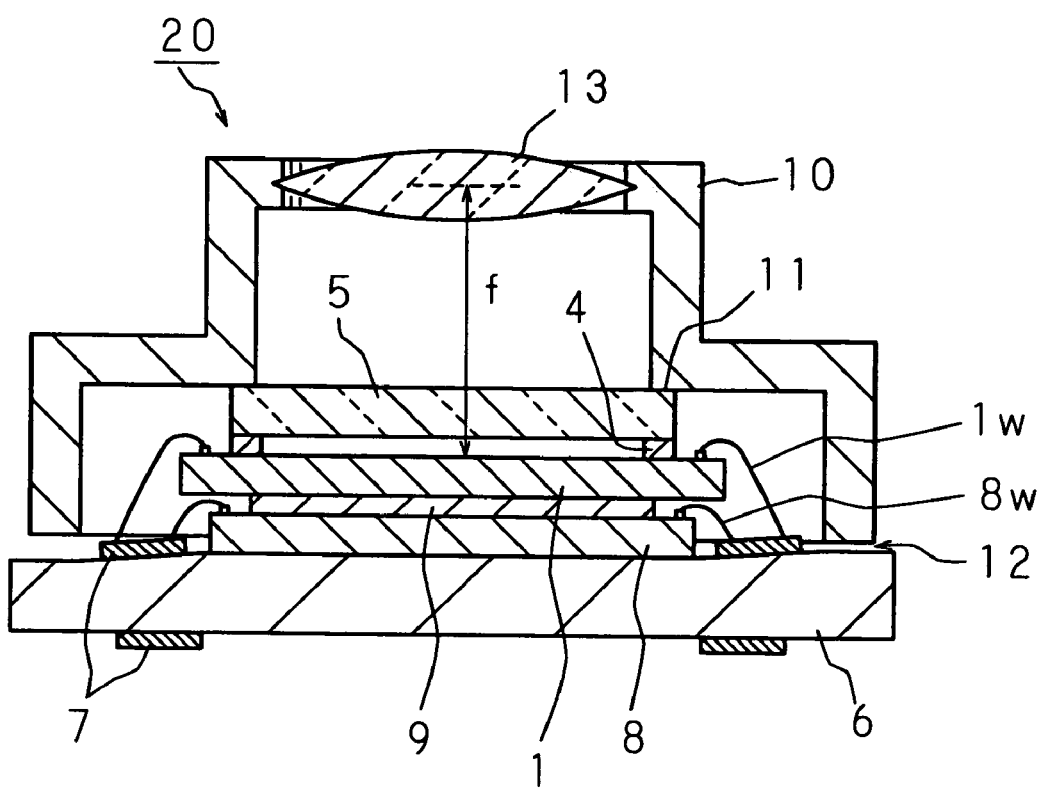
FIG. 16 is a schematic sectional view for describing an effect of a module for an optical device according to the invention.

FIG. 14 through FIG. 16 are schematic sectional views for describing the effect of the module for an optical device according to the invention. FIG. 14 shows a case where the center portion of the wiring substrate 6 has a convex shape toward the lens 13. In this case, the peripheral portion of the wiring substrate 6 is apart from the lens 13 compared to the center portion of the same, so that the adjusting portion 12, i.e., the gap between the lens holder 10 and the wiring substrate 6 is widened. However, the lens holder 10 is bonded to the transparent cover 5 at the joint portion 11, not to the wiring substrate 6, whereby the optical distance between the lens 13 and the solid-state image sensor 1 is kept to be matched with the focal length f of the lens 13, and hence, the parallel relationship between the lens 13 and the solid-state image sensor 1 is also maintained. Specifically, even if the wiring substrate 6 is deformed as shown in FIG. 14 in the module for an optical device according to the invention, the positional change of the lens 13 to the solid-state image sensor 1 does not occur, whereby the position of the lens 13 with respect to the solid-state image sensor 1 is not required to be adjusted. Moreover, the parallel relationship between the lens 13 and the solid-state image sensor 1 is also always maintained, whereby an image of a subject is correctly projected onto the solid-state image sensor 1.

FIG. 15 shows a case where the center portion of the wiring substrate 6 has a concave shape toward the lens 13. In this case, the peripheral portion of the wiring substrate 6 approaches the lens 13 compared to the center portion of the same, so that the adjusting portion 12, i.e., the gap between the lens holder 10 and the wiring substrate 6 is decreased. However, the lens holder 10 is bonded to the transparent cover 5 at the joint portion 11, not to the wiring substrate 6, whereby the optical distance between the lens 13 and the solid-state image sensor 1 is kept to be matched with the focal length f of the lens 13, and hence, the parallel relationship between the lens 13 and the solid-state image sensor 1 is also maintained. Specifically, even if the wiring substrate 6 is deformed as shown in FIG. 15 in the module for an optical device according to the invention, the positional change of the lens 13 to the solid-state image sensor 1 does not occur, whereby the position of the lens 13 with respect to the solid-state image sensor 1 is not required to be adjusted. Moreover, the parallel relationship between the lens 13 and the solid-state image sensor 1 is also always maintained, whereby an image of a subject is correctly projected onto the solid-state image sensor 1.

FIG. 16 is a schematic view showing a case where the thickness of the wiring substrate 6 is not uniform. In the example shown in FIG. 16, the thickness is great at the right-side end portion (right end in the figure) of the wiring substrate 6, while the thickness is small at the left-side end portion (left end in the figure) thereof. Assuming that the plane shape of the wiring substrate 6 is a rectangular, each side having approximately 10 mm, and the difference of the thickness between at the opposing ends of the wiring substrate 6 is ±0.01 mm in case where the thickness of the wiring substrate 6 is different at the opposing ends. Even if the thickness itself of the wiring substrate 6 is within the specification, the left-side end portion of the wiring substrate 6 is apart from the lens 13 compared to the center portion of the same, so that the adjusting portion 12 at the left-side end portion of the wiring substrate 6 is widened. On the contrary, the right-side end portion of the wiring substrate 6 approaches the lens 13 compared to the center portion of the same, so that the adjusting portion 12 at the right-side end portion of the wiring substrate 6 becomes narrow. However, the lens holder 10 is bonded to the transparent cover 5 at the joint portion 11, not to the wiring substrate 6, whereby the optical distance between the lens 13 and the solid-state image sensor 1 is kept to be matched with the focal length f of the lens 13, and hence, the parallel relationship between the lens 13 and the solid-state image sensor 1 is also maintained. Specifically, even if the thickness of the wiring substrate 6 is not uniform as shown in FIG. 16 in the module for an optical device according to the invention, the positional change of the lens 13 to the solid-state image sensor 1 does not occur, whereby the position of the lens 13 with respect to the solid-state image sensor 1 is not required to be adjusted. Moreover, the optical axis of the lens 13 is always agreed with the vertical axis of the solid-state image sensor 1, and the parallel relationship between the lens 13 and the solid-state image sensor 1 is also always maintained, whereby an image of a subject is correctly projected onto the solid-state image sensor 1.

As mentioned above in detail, the module for an optical device according to the invention employs a configuration wherein the transparent cover 5 and the lens holder 10 are joined (bonded) to each other with the surface of the transparent cover 5 defined as the positioning reference of the lens 13, thereby being capable of correctly and precisely fixing and maintaining the positional relationship between the lens 13 and the solid-state image sensor 1. Specifically, the optical distance between the lens 13 and the solid-state image sensor 1 can precisely be matched with the focal length of the lens 13, and the optical axis of the lens 13 and the vertical axis of the solid-state image sensor 1 (more specifically, the surface of the effective pixel region 2) can precisely be agreed with each other (the parallel relationship between the lens 13 and the solid-state image sensor 1 can be maintained), whereby the optical distance between the solid-state image sensor 1 and the lens 13 is not required to be adjusted even if the wiring substrate 6 is deformed. Moreover, even if the thickness of the wiring substrate 6 is not uniform, the optical axis of the lens 13 and the vertical axis of the solid-state image sensor 1 can be agreed with each other, whereby an image of a subject can correctly be projected onto the solid-state image sensor 1. Accordingly, it is unnecessary to provide a focus adjuster that is required in the conventional module for an optical device for adjusting the optical distance between the lens and the solid-state image sensor, and further, a process for a focus adjustment is unnecessary.

Additionally, since the focus adjuster is unnecessary in the invention, the number of the constituent elements can be reduced, thereby being capable of minimizing (making thin-sized and light-weight) the module for an optical device. Moreover, a facility for manufacture and manufacturing process can be simplified, resulting in being capable of enhancing the yield, reducing the material cost and production cost and achieving low cost.

Further, according to the module for an optical device according to the invention, the plane size (longitudinal and lateral sizes of the plane) of the transparent cover 5 is formed smaller than the plane size (longitudinal and lateral sizes of the plane) of the upper surface (the surface having the effective pixel region) of the solid-state image sensor 1, thereby being capable of minimizing the module for an optical device is achieved. Using the module as a camera module, in particular, can further promote the minimization of the camera.

Moreover, in the module for an optical device according to the invention, a photosensitive bonding agent is used for the bonding portion 4 that bonds the solid-state image sensor 1 and the transparent cover 5, whereby a patterning be performed by using a photolithography technique. Therefore, the bonding portion 4 between the solid-state image sensor 1 and the transparent cover 5 can easily and efficiently be formed with high precision. Moreover, the bonding portion 4 can be formed by utilizing either side of the solid-state image sensor 1 and the transparent cover 5, so that any selection can be made in accordance with the circumstance during the manufacturing process.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A module for an optical device, comprising:
a solid-state image sensor having an effective pixel region formed on one side thereof
an objective lens;
a lens holder for supporting said objective lens at a position opposite said effective pixel region and demarcating an optical path from said objective lens to said effective pixel region;
a transparent cover placed opposite said effective pixel region;
a bonding portion having substantially uniform thickness for fixedly bonding said transparent cover to said solid-state image sensor so as to form a sealed space enclosing said effective pixel region between said one side of said solid-state image sensor and said transparent cover; and
a joint portion for fixedly joining said lens holder to said transparent cover; wherein
said objective lens is positioned via said joint portion and said bonding portion with respect to said effective pixel region with said one side of said solid-state image sensor defined as a positioning reference, and
said bonding portion consists of a bonding agent having substantially uniform thickness and formed by patterning on said one side of said solid-state image sensor in a shape enclosing said effective pixel region, or on the surface of said transparent cover opposite said one side of said solid-state image sensor in a shape enclosing said effective pixel region when said transparent cover is placed opposite said effective pixel region.

2. The module for an optical device as set forth in claim 1, wherein said transparent cover is formed to have a plane size smaller than the plane size of said one side of said solid-state image sensor.

3. The module for an optical device as set forth in claim 2, comprising:
an image processing device; and
a wiring substrate, wherein
said image processing device is bonded to said wiring substrate, and
said solid-state image sensor is bonded to a plane portion of said image processing device.

4. The module for an optical device as set forth in claim 1, wherein said patterning of said bonding portion is performed by removing unnecessary portion of a photosensitive bonding agent coated with substantially uniform thickness on said one side of said solid-state image sensor, or on the surface of said transparent cover opposite said one side of said solid-state image sensor.

5. The module for an optical device as set forth in claim 4, wherein said transparent cover is formed to have a plane size smaller than the plane size of said one side of said solid-state image sensor.

6. The module for an optical device as set forth in claim 5, comprising:
an image processing device; and
a wiring substrate, wherein
said image processing device is bonded to said wiring substrate, and
said solid-state image sensor is bonded to a plane portion of said image processing device.

7. The module for an optical device as set forth in claim 1, wherein said patterning of said bonding portion is performed by printing a bonding agent in a frame-like shape with substantially uniform thickness on said one side of said solid-state image sensor, or on the surface of said transparent cover opposite said one side of said solid-state image sensor.

8. The module for an optical device as set forth in claim 7, wherein said transparent cover is formed to have a plane size smaller than the plane size of said one side of said solid-state image sensor.

9. The module for an optical device as set forth in claim 8, comprising:
an image processing device; and
a wiring substrate, wherein
said image processing device is bonded to said wiring substrate, and
said solid-state image sensor is bonded to a plane portion of said image processing device.

10. The module for an optical device as set forth in claim 1, wherein said patterning of said bonding portion is performed by affixing an adhesive sheet formed in a frame-like shape with substantially uniform thickness on said one side of said solid-state image sensor, or on the surface of said transparent cover opposite said one side of said solid-state image sensor.

11. The module for an optical device as set forth in claim 10, wherein said transparent cover is formed to have a plane size smaller than the plane size of said one side of said solid-state image sensor.

12. The module for an optical device as set forth in claim 11, comprising:
   an image processing device; and
   a wiring substrate, wherein
   said image processing device is bonded to said wiring substrate, and
   said solid-state image sensor is bonded to a plane portion of said image processing device.

13. The module for an optical device as set forth in claim 1, wherein said patterning of said bonding portion is performed by coating a bonding agent with use of dispense method in a frame-like shape with substantially uniform thickness on said one side of said solid-state sensor, or on the surface of said transparent cover opposite said one side of said solid-state image sensor.

14. The module for an optical device as set forth in claim 13, wherein said transparent cover is formed to have a plane size smaller than the plane size of said one side of said solid-state image sensor.

15. The module for an optical device as set forth in claim 14, comprising:
   an image processing device; and
   a wiring substrate, wherein
   said image processing device is bonded to said wiring substrate, and
   said solid-state image sensor is bonded to a plane portion of said image processing device.

* * * * *